(12) United States Patent
Uchida et al.

(10) Patent No.: US 11,795,543 B2
(45) Date of Patent: Oct. 24, 2023

(54) SILICON-CONTAINING PRODUCT FORMING APPARATUS

(71) Applicants: KABUSHIKI KAISHA TOSHIBA, Minato-ku (JP); Kioxia Corporation, Minato-ku (JP)

(72) Inventors: Kenya Uchida, Yokohama (JP); Hiroyuki Fukui, Yokkaichi (JP); Ikuo Uematsu, Yokohama (JP)

(73) Assignees: KABUSHIKI KAISHA TOSHIBA, Minato-ku (JP); Kioxia Corporation, Minato-ku (JP)

( * ) Notice: Subject to any disclaimer, the term of this patent is extended or adjusted under 35 U.S.C. 154(b) by 589 days.

(21) Appl. No.: 16/751,354

(22) Filed: Jan. 24, 2020

(65) Prior Publication Data
US 2020/0240012 A1    Jul. 30, 2020

(30) Foreign Application Priority Data

Jan. 25, 2019 (JP) .................................. 2019-011502

(51) Int. Cl.
| | |
|---|---|
| *C23C 16/44* | (2006.01) |
| *B01D 53/68* | (2006.01) |
| *B01D 53/79* | (2006.01) |
| *C30B 25/14* | (2006.01) |
| *C30B 29/06* | (2006.01) |

(52) U.S. Cl.
CPC .......... *C23C 16/4412* (2013.01); *B01D 53/68* (2013.01); *B01D 53/79* (2013.01); *C30B 25/14* (2013.01); *C30B 29/06* (2013.01); *B01D 2257/204* (2013.01); *B01D 2257/553* (2013.01)

(58) Field of Classification Search
CPC ........ B01D 2257/204; B01D 2257/553; B01D 2258/0216; B01D 53/46; B01D 53/68; B01D 53/79; C23C 16/4412; C30B 25/14; C30B 29/06

See application file for complete search history.

(56) References Cited

U.S. PATENT DOCUMENTS

| | | | |
|---|---|---|---|
| 2004/0018746 A1* | 1/2004 | Arno .................. | G01N 21/3504 438/758 |
| 2012/0052203 A1 | 3/2012 | Miyashita et al. | |

(Continued)

FOREIGN PATENT DOCUMENTS

| | | |
|---|---|---|
| JP | 11 -233505 A | 8/1999 |
| JP | 2003-124205 A | 4/2003 |

(Continued)

*Primary Examiner* — Matthew J Song
(74) *Attorney, Agent, or Firm* — Oblon, McClelland, Maier & Neustadt, L.L.P.

(57) ABSTRACT

According to one embodiment, a silicon-containing product forming apparatus includes a reaction chamber, an emission path, a process liquid tank, a supplier, and a flow path switcher. The emission path emits an emission material from the reaction chamber. The supplier includes a supply line configured to supply a process liquid to the emission path from the process liquid tank, and a byproduct generated by reaction is treated in the emission path by the supplied process liquid. The flow path switcher switches the communication state of the emission path with each of the reaction chamber and the supply line of the supplier.

8 Claims, 2 Drawing Sheets

(56) References Cited

U.S. PATENT DOCUMENTS

| | | | |
|---|---|---|---|
| 2013/0156950 A1* | 6/2013 | Yamada | C23C 16/4412 427/248.1 |
| 2017/0067152 A1 | 3/2017 | Hayashi | |
| 2017/0200622 A1 | 7/2017 | Shiokawa et al. | |
| 2017/0287701 A1 | 10/2017 | Miyazaki | |
| 2020/0033000 A1 | 1/2020 | Yanagisawa et al. | |

FOREIGN PATENT DOCUMENTS

| | | |
|---|---|---|
| JP | 2004-289098 A | 10/2004 |
| JP | 2006-4962 A | 1/2006 |
| JP | 2008-114139 A | 5/2008 |
| JP | 2012-049342 A | 3/2012 |
| JP | 2013-197474 A | 9/2013 |
| JP | 2017-054862 A | 3/2017 |
| JP | 2018-186228 A | 11/2018 |
| TW | 201604315 A | 2/2016 |
| WO | WO 2018/221021 A1 | 12/2018 |

* cited by examiner

SILICON-CONTAINING PRODUCT FORMING APPARATUS

CROSS-REFERENCE TO RELATED APPLICATIONS

This application is based upon and claims the benefit of priority from Japanese Patent Application No. 2019-011502, filed Jan. 25, 2019; the entire contents of which are incorporated herein by reference.

FIELD

Embodiments described herein generally relate to a silicon-containing product forming apparatus.

BACKGROUND

Semiconductor silicon substrates are widely used as materials for forming various electronic circuits. In each case of forming such a semiconductor silicon substrate, and forming a film or an ingot containing a silicon-containing product, a silicon-containing product forming apparatus such as an epitaxial growth apparatus and a chemical phase growth apparatus is used.

An epitaxial growth apparatus includes a reaction chamber, and a supply tube and an emission tube which are connected with the reaction chamber. The reaction chamber is supplied with a source gas via the supply tube. Then, an emission gas is emitted from the reaction chamber via the emission tube. At the time of using an epitaxial growth apparatus, a substrate is placed in the reaction chamber under reduced pressure in an inert atmosphere. Then, by reacting the source gas introduced into the reaction chamber and the heated substrate, a film containing a silicon-containing product is formed on the substrate. As the source gas, for example, a mixed gas of a compound containing silicon and chlorine, and hydrogen gas is used. The source gas having reacted with the substrate in the reaction chamber is emitted outside the apparatus as an emission gas via the emission tube. The emission gas can contain a component in the source gas, for example, a compound containing silicon and chlorine.

Here, the temperature in the reaction chamber is very high compared with that in the emission tube. Therefore, the compound containing silicon and chlorine contained in the emission gas emitted into the emission tube is cooled inside the emission tube, and can precipitate as a byproduct. The byproduct can contain a liquid substance having high viscosity, called oily silane, and a solid substance. The byproduct can contain a substance that is generated secondarily as a result of degeneration of the oily silane in air or water. It is demanded to safely detoxify such a byproduct. From the viewpoint of improving the safety and reducing the operation time, it is requested to detoxify the byproduct without detaching piping such as an emission tube that forms an emission path of the emission gas.

DETAILED DESCRIPTION

Figure 1:
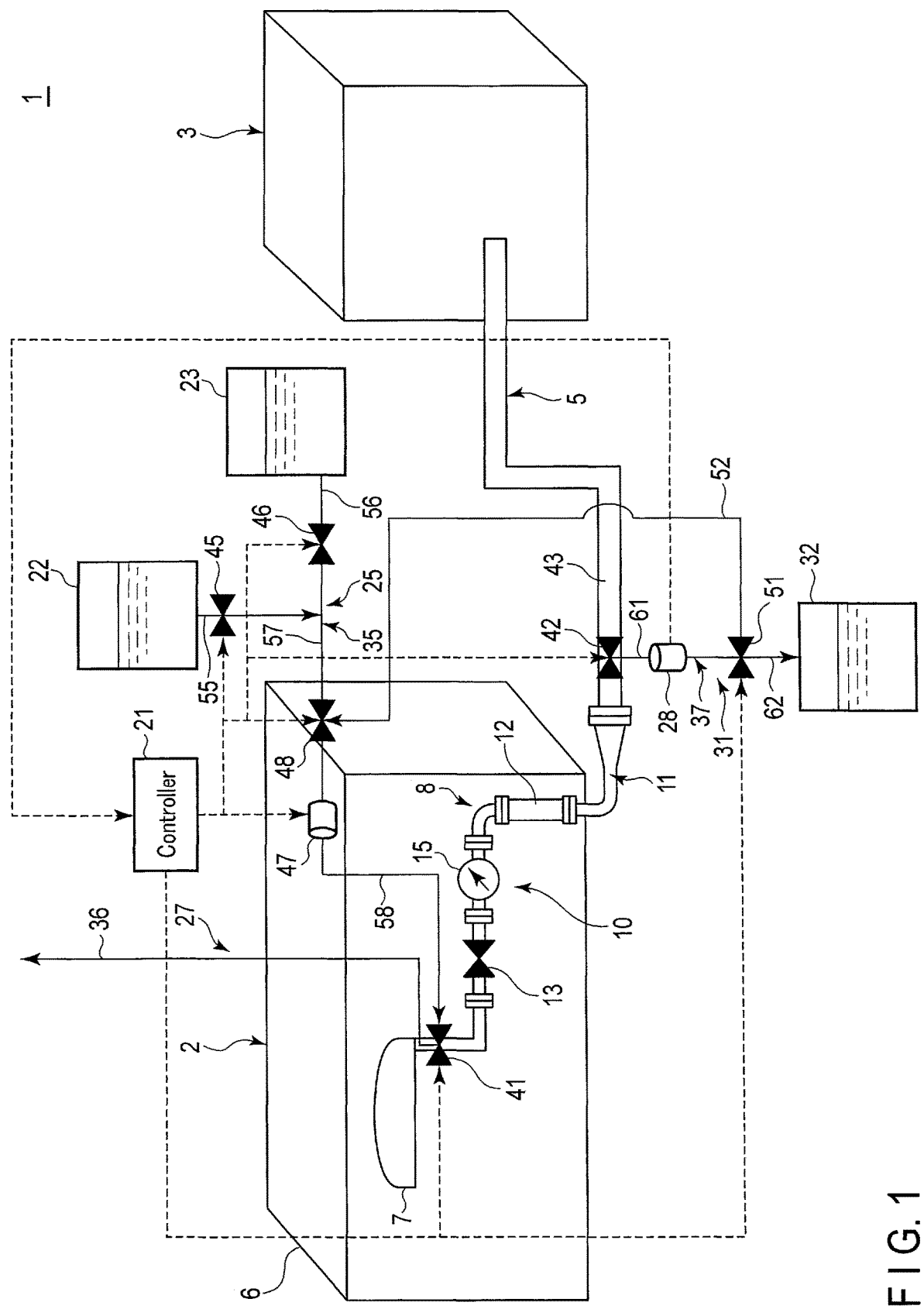
FIG. 1 is a schematic view showing an epitaxial growth apparatus according to the first embodiment.

According to an embodiment, the silicon-containing product forming apparatus includes a reaction chamber, an emission path, a process liquid tank, a supplier, and a flow path switcher. In the reaction chamber, a raw material including silicon and a halogen element reacts or a raw material including silicon and a raw material including a halogen element react. The emission path is configured to emit an emission material from the reaction chamber. The emission path is incorporated in an emitter. The process liquid tank stores a process liquid including a basic aqueous solution. The supplier includes a supply line configured to supply a process liquid to the emission path from the process liquid tank, and a byproduct generated by reaction is treated in the emission path by the supplied process liquid. The flow path switcher switches the communication state of the emission path with each of the reaction chamber and the supply line of the supplier.

Hereinafter, embodiments will be described with reference to FIG. 1 and FIG. 2.

First Embodiment

First, as one example of a silicon-containing product forming apparatus according to an embodiment, an epitaxial growth apparatus according to the first embodiment is described. FIG. 1 shows an epitaxial growth apparatus 1 according to the first embodiment. As shown in FIG. 1, the epitaxial growth apparatus 1 according to the present embodiment includes an apparatus main body 2, a detoxification apparatus 3, and a joint 5. The apparatus main body 2 includes a casing 6, a reaction chamber 7, an emission tube 8, and a supply tube (not shown). The reaction chamber 7, the emission tube 8 and the supply tube are accommodated in the casing 6. One end of the supply tube is connected with the reaction chamber 7, and the other end of the supply tube is connected with the gas supply source (not shown) of a source gas which is a raw material. In the present embodiment, the supply tube forms a gas supplier (gas supply system) configured to supply the reaction chamber 7 with a source gas from the gas supply source.

One end of the emission tube 8 is connected with the reaction chamber 7, and the other end of the emission tube 8 is connected with the joint 5. The emission tube 8 is provided with a chamber isolation valve (CIV) 13 and a pressure control valve (PCV) 15. In the present embodiment, the chamber isolation valve 13 is disposed on the reaction chamber 7 side (upstream side) with respect to the pressure control valve 15. In the state that the chamber isolation valve 13 is closed, maintenance can be performed only in a site on the side opposite to the reaction chamber 7 (downstream side) with respect to the chamber isolation valve 13 in the emission tube 8. One end of the joint 5 is connected with the emission tube 8, and the other end of the joint 5 is connected with the detoxification apparatus 3. Each of the emission tube 8 and the joint 5 is formed of one or more piping (pipes).

The epitaxial growth apparatus 1 includes an emitter (emission system) 10, a controller 21, a wash water tank 22, a process liquid tank 23, a supplier (supply system) 25, an exhauster (exhaust system) 27, a sensor 28, a liquid emitter (liquid emission system) 31, and a waste liquid tank 32, in addition to the aforementioned reaction chamber 7. In FIG. 1, the solid arrow indicates the flow of fluids such as liquid and gas, and the dotted arrow indicates electric signals such as input signals to the controller 21 and output signals from the controller 21.

In the present embodiment, the emitter 10 is formed of the emission tube 8, the joint 5, and the detoxification apparatus 3. In the present embodiment, the emission tube 8 and the joint 5 form the emission path 11 of the emitter 10. Therefore, the aforementioned chamber isolation valve 13 and pressure control valve 15 are disposed in the emission path 11. The emission path 11 is capable of communicating with the reaction chamber 7.

The controller 21 controls the entire epitaxial growth apparatus 1. The controller 21 includes a processor or an integrated circuit (control circuit) including a central processing unit (CPU), an application specific integrated circuit (ASIC) or a field programmable gate array (FPGA), and a storage medium such as memory. The controller 21 may include only one processor or integrated circuit, or a plurality of processors or integrated circuits. The controller 21 performs processing by executing a program or the like stored in the storage medium.

The supplier (liquid supplier) 25 includes a supply line 35. The exhauster 27 includes an exhaust line 36, and the liquid emitter 31 includes a liquid emission line 37. Each of the supply line 35, the exhaust line 36, and the liquid emission line 37 is formed of one or more piping (pipes). Each of the supply line 35, the exhaust line 36, and the liquid emission line 37 is connected with the emission path 11 of the emitter 10.

In the present embodiment, the epitaxial growth apparatus 1 includes switching valves 41, 42 as a flow path switcher. The switching valves 41, 42 are disposed in the emission path 11 of the emitter 10. The switching valve 41 is disposed on the reaction chamber 7 side (upstream side) with respect to the aforementioned chamber isolation valve 13 and pressure control valve 15. The switching valve 42 is disposed on the side opposite to the reaction chamber 7 (downstream side) with respect to the chamber isolation valve 13 and pressure control valve 15. In the emission path 11 of the present embodiment, only one extension 12 is formed from the reaction chamber 7 side (upstream side) to the detoxification apparatus 3 side (downstream side) between the switching valves 41, 42. In the emission path. 11, a relay 43 is formed from the switching valve 42 to the detoxification apparatus 3.

In the present embodiment, the supply line 35 of the supplier 25 and the exhaust line 36 of the exhauster 27 are connected with the emission path 11 of the emitter 10 by the switching valve (first flow path switcher) 41. The liquid emission line 37 of the liquid emitter 31 is connected with the emission path 11 of the emitter 10 by the switching valve (second flow path switcher) 42.

In the present embodiment, the switching valve 41 is switchable between a first operation state and a second operation state. In the first operation state of the switching valve 41, the extension 12 of the emission path 11 of the emitter 10 communicates with the reaction chamber 7. In the first operation state of the switching valve 41, however, communication of the emission path 11 (extension 12) of the emitter 10 with each of the supply line 35 of the supplier 25, and the exhaust line 36 of the exhauster 27 is blocked. On the other hand, in the second operation state of the switching valve 41, the emission path 11 (extension 12) of the emitter 10 communicates with each of the supply line 35 of the supplier 25 and the exhaust line 36 of the exhauster 27. In the second operation state of the switching valve 41, however, communication of the extension 12 of the emission path 11 of the emitter 10 with the reaction chamber 7 is blocked. Therefore, as a result of switching of the operation state of the switching valve (flow path switcher) 41, the communication state of the emission path 11 (extension 12) with each of the reaction chamber 7, the supply line 35 of the supplier 25, and the exhaust line 36 of the exhauster 27 is switched.

The switching valve 42 is switchable between a third operation state and a fourth operation state. In the third operation state of the switching valve 42, the extension 12 of the emission path 11 of the emitter 10 communicates with the detoxification apparatus 3 via the relay 43. In the third operation state of the switching valve 42, however, communication of the emission path 11 (extension 12) of the emitter 10 with the liquid emission line 37 of the liquid emitter 31 is blocked. On the other hand, in the fourth operation state of the switching valve 42, the emission path 11 (extension 12) of the emitter 10 communicates with the liquid emission line 37 of the liquid emitter 31. In the fourth operation state of the switching valve 42, however, communication of the extension 12 of the emission path 11 of the emitter 10 with the detoxification apparatus 3 (relay 43) is blocked. Therefore, as a result of switching of the operation state of the switching valve (flow path switcher) 42, the communication state of the emission path 11 (extension 12) with each of the liquid emission line 37 of the liquid emitter 31, and the detoxification apparatus 3 is switched.

In the present embodiment, operations of the switching valves 41, 42 are controlled by the controller 21, and the operation state of each of the switching valves 41, 42 is switched by the controller 21. In one example, the controller 21 switches the operation state of each of the switching valves 41, 42 based on the operation by the operator with an operation apparatus (not shown) such as a user interface. Switching of the operation state of each of the switching valves 41, 42 is not necessarily performed by the controller 21, and in another example, switching of the operation state of each of the switching valves 41, 42 may be performed by an operator without being mediated by the controller 21.

In the epitaxial growth apparatus 1, the switching valve 41 is switched to the first operation state, and the switching valve 42 is switched to the third operation state in supply of the source gas which is a raw material from the gas supply source to the reaction chamber 7 by the gas supplier. In other words, in the state that the source gas is introduced into the reaction chamber 7, the reaction chamber 7 communicates with the detoxification apparatus 3 via the emission path 11 (extension 12) of the emitter 10, and the emission path 11 (extension 12) communicates with none of the supply line 35 of the supplier 25, the exhaust line 36 of the exhauster 27, and the liquid emission line 37 of the liquid emitter 31.

The source gas is a gas containing silicon and a halogen element. Therefore, the source gas includes one or more kinds of halogen elements, and silicon. The halogen elements belong to group 17, and examples of the halogen elements include fluorine (F), chlorine (Cl), bromine (Br) and iodine (I). The gas containing silicon and a halogen element is, for example, a mixed gas of a compound containing silicon and a halogen element, and hydrogen. The concentration of hydrogen in the mixed gas is, for example, 95% by volume or more. The compound containing silicon and a halogen element includes one or more compounds selected from the group consisting of a compound containing silicon and chlorine, a compound containing silicon and bromine, a compound containing silicon and fluorine, and a compound containing silicon and iodine. The compound containing silicon and a halogen element includes halosilanes.

The compound containing silicon and chlorine is, for example, any one of chlorosilanes such as dichlorosilane ($SiH_2Cl_2$), trichlorosilane ($SiHCl_3$), and tetrachlorosilane ($SiCl_4$), or a mixture of these chlorosilanes. When the compound containing silicon and chlorine is contained in the mixed gas, the mixed gas may contain at least either of monosilane ($SiH_4$) and hydrogen chloride (HCl). The compound containing silicon and bromine is, for example, any one of bromosilanes such as dibromosilane ($SiH_2Br_2$), tribromosilane ($SiHBr_3$), and tetrabromosilane ($SiBr_4$), or a mixture of these bromosilanes. When the compound containing silicon and bromine is contained in the mixed gas, the mixed gas may contain at least either of monosilane ($SiH_4$) and hydrogen bromide (HBr).

The source gas may include two or more halogen elements, and the source gas may contain any one or more halogen elements other than chlorine in addition to chlorine. In one example, the source gas is a mixed gas of a compound containing silicon and chlorine, hydrogen gas, and at least one of a compound containing a halogen element other than chlorine and a halogen gas other than chlorine gas. The compound containing a halogen element other than chlorine may contain silicon, or need not contain silicon. In another example, the source gas is a mixed gas of a compound containing a halogen element other than chlorine and silicon, hydrogen gas, and at least one of a compound containing chlorine and a chlorine gas. The compound containing chlorine may contain silicon, or need not contain silicon.

In the state that the reaction chamber 7 communicates with the extension 12 of the emission path 11, the pressure of the reaction chamber 7 can be reduced by the pressure control valve 15. As the pressure of the reaction chamber 7 is reduced by the pressure control valve 15, the pressure rises in a region on the side opposite to the reaction chamber 7 with respect to the pressure control valve 15, as compared with the region on the reaction chamber 7 side with respect to the pressure control valve 15 in the emission path 11. In the epitaxial growth apparatus 1, a substrate is placed in the reaction chamber 7 in the condition that the pressure of the reaction chamber 7 is reduced. In the reaction chamber 7, the source gas supplied via the supply tube reacts with the substrate. At this time, the substrate is heated to the reaction temperature at which the substrate starts to react with the source gas or higher. In one example, the reaction temperature is 600° C. or more, and in another example, the reaction temperature is 1000° C. or more. As described above, a film containing monocrystalline or polycrystalline silicon is formed on the substrate by the thermochemical reaction between the source gas and the substrate under reduced pressure and high temperature. The substrate is, for example, a monocrystalline silicon substrate.

Emission gas which is an emission material from the reaction chamber 7 is emitted to the detoxification apparatus 3 via the emission path 11 (extension 12 and relay 43). The emission gas can include a part not having deposited on the substrate in the compound containing silicon and a halogen element contained in the source gas. Therefore, the emission gas can contain a part not having deposited on the substrate in the halosilanes contained in the source gas. The emission gas can include a part not having reacted in the reaction chamber 7, in the compound containing silicon and a halogen element contained in the source gas. The emission gas can include halosilanes generated by the reaction of the compound containing a halogen element and silicon in the reaction chamber 7. Further, the emission gas which is an emission material can contain the aforementioned monosilane ($SiH_4$), and can contain the aforementioned hydrogen halide such as hydrogen chloride (HCl) and hydrogen bromide (HBr). The emission gas is detoxified by combustion in the detoxification apparatus 3.

A byproduct generated in the reaction between the source gas and the substrate can precipitate in a part of the emission path 11 (extension 12). The byproduct is generated by reaction of components contained in the aforementioned emission gas, followed by solidification or liquefaction. For example, by reaction of halosilanes contained in the emission gas in the emission path 11, a byproduct can generate. Reaction of halosilanes with other component contained in the emission gas in the emission path 11 can also result in generation of a byproduct. The generated byproduct can adhere, for example, on the inner surface of the piping that forms the emission path 11.

The byproduct generated in the manner as descried above can contain a liquid substance having high viscosity that is also called oily silane, and a solid substance. The byproduct can contain a substance that is generated secondarily as a result of degeneration of the oily silane in air or water. Such a byproduct includes halosilanes. Halosilanes can generate by reaction of the compound containing a halogen element and silicon. Halosilanes have a Si-α bond (α is one or more halogen elements selected from the group consisting of Cl, Br, F and I), and a Si—Si bond.

Examples of halosilanes include chlorosilanes and bromosilanes. Chlorosilanes contain chlorine as a halogen element, and have a Si—Cl bond and a Si—Si bond. Bromosilanes contain bromine as a halogen element, and have a Si—Br bond and a Si—Si bond. Halosilanes may include two or more halogen elements, and in one example, halosilanes contain any one halogen element other than chlorine, in addition to chlorine.

Halosilanes contained in a byproduct sometimes do not degenerate. On the other hand, as described above, halosilanes have a Si-α bond (α is one or more halogen elements selected from the group consisting of Cl, Br, F and I), and a Si—Si bond, and these bonds can show high reactivity with water and oxygen. Therefore, halosilanes rapidly react with water and oxygen in the atmosphere, and can degenerate into a substance having explosiveness. Therefore, it is necessary to safely detoxify the byproduct.

Halosilanes contained in a byproduct can include halosilanes having a cyclic structure, and halosilanes not having a cyclic structure. Halosilanes having a cyclic structure can include any one of compounds having the structures shown in structural formulas (1) to (25). Therefore, halosilanes having a cyclic structure can have any one of a four-membered cyclic structure, five-membered cyclic structure, six-membered cyclic structure, seven-membered cyclic structure, eight-membered cyclic structure, and many-membered cyclic structure. In the structural formulas (1) to (25), X is one or more halogen elements selected from the group consisting of Cl, Br, F and I.

[Chemical 1]

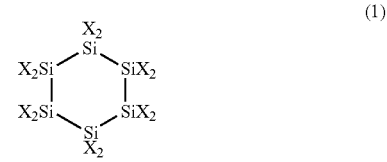

(1)

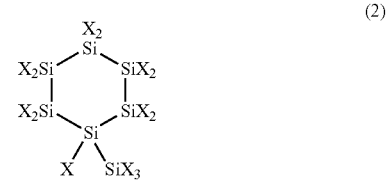

(2)

-continued
(3)
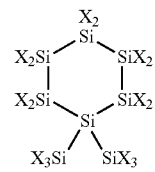
(4)
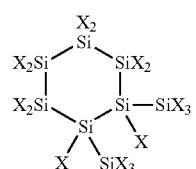
[Chemical 2]
(5)
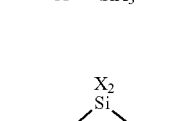
(6)
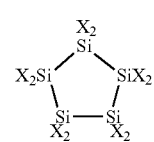
(7)
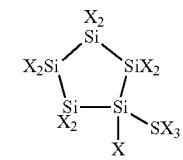
[Chemical 3]
(8)
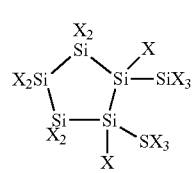
(9)
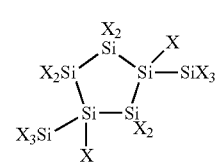
(10)
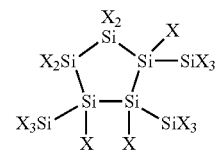
[Chemical 4]
(11)
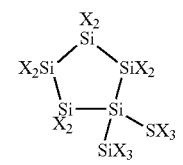
-continued
(12)
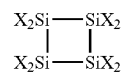
(13)
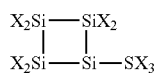
(14)
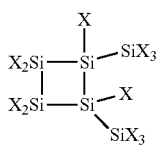
(15)
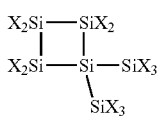
[Chemical 5]
(16)
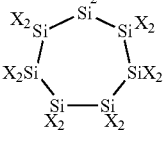
(17)
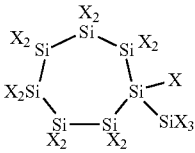
(18)
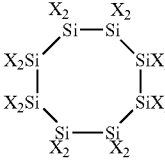
(19)
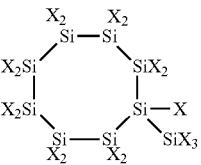
[Chemical 6]
(20)
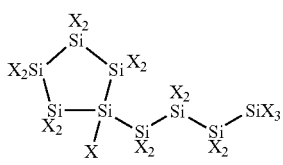
(21)
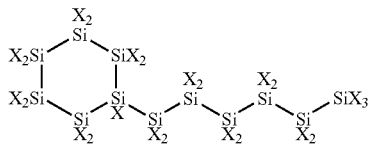

-continued

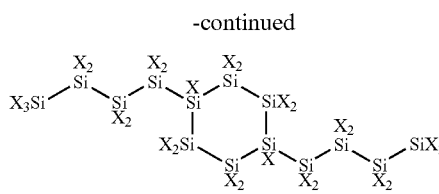
(22)

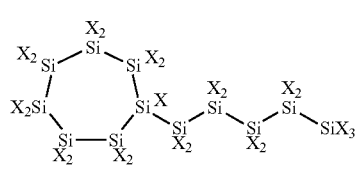
(23)

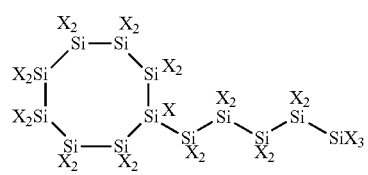
(24)

[Chemical 7]

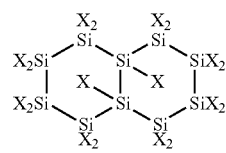
(25)

Halosilanes having a cyclic structure contained in the byproduct can be a homocyclic compound having a silicon ring formed exclusively of silicon as shown in the structural formulas (1) to (25). The halosilanes having a cyclic structure can be an inorganic cyclic compound free of carbon as shown in the structural formulas (1) to (25). Halosilanes having a cyclic structure may include a heterocyclic compound formed of silicon and oxygen.

Halosilanes not having a cyclic structure can include halosilanes having a chain structure. Halosilanes having a chain structure can include either of compounds having the structures shown in structural formulas (26) and (27). In the structural formula (26), N is, for example, 0, or a positive integer of 15 or less. In the structural formulas (26) and (27), X is one or more halogen elements selected from the group consisting of Cl, Br, F and I.

[Chemical 8]

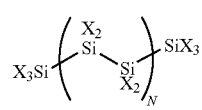
(26)

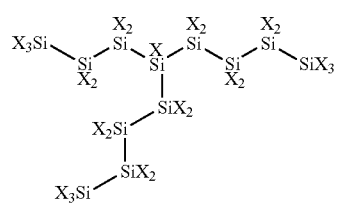
(27)

Halosilanes having a chain structure can be a straight-chain compound without a branch as shown in the structural formula (26). Halosilanes having a chain structure can be a chain compound with a branch as shown in the structural formula (27).

The byproduct can include a hydrolysate that can be secondarily generated by contact of the aforementioned halosilanes with water. The hydrolysate can be a solid substance. The hydrolysate of halosilanes can have a Si—Si bond as with the halosilanes. The hydrolysate can be siloxanes. The hydrolysate can include a compound having at least one of a siloxane bond (Si—O—Si, O—Si—O) and a silanol group (—Si—OH). The hydrolysate can have a hydrosilanol group (—Si(H)OH). The hydrolysate contained in the byproduct can have any one of the structures indicated by structural formulas (28) to (33).

[Chemical 9]

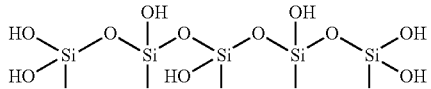
(28)

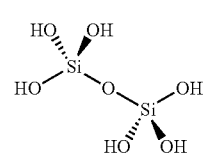
(29)

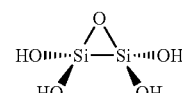
(30)

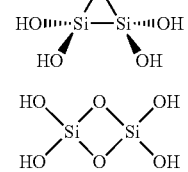
(31)

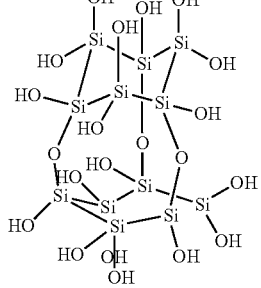
(32)

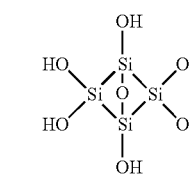
(33)

The hydrolysates shown in the structural formulas (28) to (33) are hydrolysates consisting exclusively of silicon, oxygen, and hydrogen. The hydrolysates shown in the structural formulas (28) to (33) have both a siloxane bond and a silanol group. The hydrolysates shown in the structural formulas (28) to (33) are polysilanols having two or more silanol groups. In the hydrolysate contained in the byproduct, the Si—Si bond and the siloxane bond can be a cause of explosiveness. The byproduct can include silica.

Here, in a site on the near side from the reaction chamber 7 in the emission path 11, for example, in a site between the switching valve 41 and the chamber isolation valve 13, the temperature is high. In the region on the reaction chamber 7 side with respect to the pressure control valve 15, the pressure is reduced as in the reaction chamber 7. Therefore, it is considered that reaction of components contained in the emission gas is difficult to occur, and a byproduct is difficult to generate in the region of the reaction chamber 7 side with respect to the pressure control valve 15.

Also, as described above, the pressure rises in a region on the side opposite to the reaction chamber 7 with respect to the pressure control valve 15, as compared with the region on the reaction chamber 7 side with respect to the pressure control valve 15. Therefore, in the pressure control valve 15, the pressure rises on the downstream side as compared with the upstream side. Therefore, it is considered that the reaction between components contained in the emission gas is easy to progress, and a byproduct is easy to be generated in the site neighboring the pressure control valve 15 on the downstream side in the emission path 11. Therefore, it is considered that a byproduct is easy to generate particularly in the pressure control valve 15, and in the site neighboring the pressure control valve 15 on the downstream side in the emission path 11. That is, it is considered that a byproduct is easy to generate in the pressure control valve 15 and its neighborhood in the emission path 11 (extension 12). The aforementioned reaction between components contained in the emission gas is difficult to occur under reduced pressure.

The quantity of components which are raw materials of a byproduct in the emission gas is small in a site distanced from the pressure control valve 15 on the downstream side in the emission path 11, such as in a site near the detoxification apparatus 3 in the emission path 11. Therefore, it is considered that a byproduct is difficult to be generated in a site distanced from the pressure control valve 15 on the downstream side in the emission path 11.

As described above, in the epitaxial growth apparatus 1, a byproduct is generated in the emission path 11 by the reaction between the source gas and the substrate. In the epitaxial growth apparatus 1 of the present embodiment, after the treatment of reacting the source gas with the substrate to form a silicon-containing film on the substrate is performed, a treatment of detoxifying the byproduct generated in the emission path 11 is performed.

In the epitaxial growth apparatus 1, the switching valve 41 is switched to the second operation state, and the switching valve 42 is switched to the fourth operation state in detoxification of the byproduct. That is, in the state that detoxification of the byproduct is performed in the emission path 11, the extension 12 of the emission path 11 of the emitter 10 communicates with none of the reaction chamber 7 and the detoxification apparatus 3. In the state that detoxification of the byproduct is performed in the emission path 11, the extension 12 of the emission path 11 of the emitter 10 communicates with each of the supply line 35 of the supplier 25, the exhaust line 36 of the exhauster 27, and the liquid emission line 37 of the liquid emitter 31.

In the present embodiment, the emission path 11 of the emitter 10 is connected with the wash water tank 22 and the process liquid tank 23 via the supply line 35 of the supplier 25. The wash water tank 22 stores wash water. The process liquid tank 23 stores process liquid. The process liquid is used for detoxification of the byproduct. The process liquid includes a basic aqueous solution. The supplier (liquid supplier) 25 enables supply of the wash water from the wash water tank 22 to the extension 12 of the emission path 11, and enables supply of the process liquid from the process liquid tank 23 to the extension 12 of the emission path 11.

In the present embodiment, the supplier 25 includes valves 45, 46, 48, and a flow rate regulator 47 such as a pump in addition to the aforementioned supply line 35. The supply line 35 includes flow path portions 55 to 58. The flow path portion 55 extends from the wash water tank 22 to the valve 45, and the flow path portion 56 extends from the process liquid tank 23 to the valve 46. The flow path portion 57 extends from each of the valves 45, 46 to the valve 48. In the present embodiment, a meeting part of the supply path from the wash water tank 22 and the supply path from the process liquid tank 23 is formed in the flow path portion 57. The flow path portion 58 extends from the valve 48 to the switching valve 41 through the flow rate regulator 47.

In the present embodiment, the emission path 11 of the emitter 10 is connected with the waste liquid tank 32 via the liquid emission line 37 of the liquid emitter 31. The liquid emitter 31 enables emission of the process liquid used for detoxification of the byproduct from the extension 12 of the emission path 11. The waste liquid tank 32 stores the process liquid emitted from the emission path 11.

In the present embodiment, the liquid emitter 31 includes a valve 51 in addition to the aforementioned liquid emission line 37. The liquid emission line 37 includes flow path portions 61, 62. The flow path portion 61 extends from the switching valve 42 to the valve 51. The flow path portion 62 extends from the valve 51 to the waste liquid tank 32.

The epitaxial growth apparatus 1 includes a circulation line 52. The circulation line 52 is formed of one or more piping (pipes). One end of the circulation line 52 is connected with the supply line 35, and the other end of the circulation line 52 is connected with the liquid emission line 37. The circulation line 52 is connected with the supply line 35 by the valve 48. The circulation line 52 is connected with the liquid emission line 37 by the valve 51.

The operation state of each of the valves 45, 46 is switchable between the open state and the closed state. In the open state of the valve 45, the flow path portions 55, 57 communicate with each other in the supply line 35, and in the closed state of the valve 45, communication between the flow path portions 55, 57 is blocked in the supply line 35. In the open state of the valve 46, the flow path portions 56, 57 communicate with each other in the supply line 35, and in the closed state of the valve 46, communication between the flow path portions 56, 57 is blocked in the supply line 35.

The operation state of each of the valves 48, 51 is switchable between the circulation state and the non-circulation state. In the circulation state of the valve 48, the flow path portion 58 of the supply line 35 communicates with the circulation line 52, and communication between the flow path portions 57, 58 is blocked in the supply line 35. In the non-circulation state of the valve 48, flow path portions 57, 58 communicate with each other in the supply line 35, and communication between the supply line 35 and the circulation line 52 is blocked. In the circulation state of the valve 51, the flow path portion 61 of the liquid emission line 37 communicates with the circulation line 52, and communication between the flow path portions 61, 62 is blocked in the liquid emission line 37. In the non-circulation state of the valve 51, the flow path portions 61, 62 communicate with each other in liquid emission line 37, and communication between the liquid emission line 37 and the circulation line 52 is blocked.

As the operation state of the flow rate regulator 47 such as a pump changes, the flow rate of the wash water or the process liquid passing through the flow path portion 58 in the supply line 35 varies. As the flow rate of the flow path portion 58 varies, the injection pressure of the wash water or the process liquid to the emission path 11 from the supply line 35 varies. Therefore, by control of the operation of the flow rate regulator 47, the flow rate of the flow path portion 58 is regulated, and the injection pressure from the supply line 35 to the emission path 11 is regulated.

In the present embodiment, operations of the valves 45, 46, 48, 51 and the flow rate regulator 47 are controlled by the controller 21, and the operation state of each of the valves 45, 46, 48, 51 and the flow rate regulator 47 is switched by the controller 21. In one example, the controller 21 switches the operation state of each of the valves 45, 46, 48, 51 and the flow rate regulator 47 based on the operation made by an operator through an operational device such as a user interface (not shown). Switching of the operation state of each of the valves 45, 46, 48, 51 and the flow rate regulator 47 is not necessarily performed by the controller 21, and in another example, switching of the operation state of each of the valves 45, 46, 48, 51 and the flow rate regulator 47 may be performed by an operator without being mediated by the controller 21.

In the present embodiment, by bringing the valve 46 into the open state, and bringing the valve 48 into the non-circulation state, the process liquid is supplied from the process liquid tank 23 through the supply line 35 by the supplier 25. Since the switching valve 41 is in the second operation state as described above, the process liquid is injected to the extension 12 of the emission path from the supply line 35, and the emission path 11 (extension 12) is supplied with the process liquid. In the emission path 11 (extension 12), a byproduct adhered to the piping or the like forming the emission path 11 is detoxified by the process liquid supplied by the supplier 25.

As described above, the process liquid includes a basic aqueous solution. As described above, halosilanes have a Si-$\alpha$ bond ($\alpha$ is one or more halogen elements selected from the group consisting of Cl, Br, F and I), and a Si—Si bond, as bonds showing high reactivity with water and oxygen. By the reaction between the halosilanes and the basic process liquid, the aforementioned bonds showing high reactivity with water and oxygen are broken. For example, by the reaction between chlorosilanes and the basic process liquid, a Si—Cl bond and a Si—Si bond are broken.

The hydrolysate that can be contained in the byproduct can have a siloxane bond and a Si—Si bond that can be a cause of explosiveness, as described above. By the reaction between the hydrolysate and the basic process liquid, the aforementioned bonds that can be a cause of explosiveness are broken.

Therefore, the process liquid after the reaction with the byproduct is almost free of an explosive substance. By bringing the byproduct and the basic process liquid into contact with each other in the manner as described above, the byproduct is decomposed without generation of an explosive substance. That is, the byproduct generated in the reaction between the gas containing silicon and a halogen element and the substrate is safely detoxified.

By the detoxification reaction of the byproduct with the process liquid, a hydrogen halide can be generated. For example, when the byproduct contains chlorosilanes, hydrogen chloride (HCl) can be generated by the reaction between the process liquid and the byproduct. When the byproduct contains bromosilanes, hydrogen bromide (HBr) can be generated by the reaction between the process liquid and the byproduct. An aqueous solution of a hydrogen halide such as hydrogen chloride is acidic. Therefore, pH of the process liquid tends to be low because of generation of a hydrogen halide by the reaction between the byproduct and the process liquid. In the present embodiment, since the hydrogen halide is neutralized by the process liquid by using the basic process liquid, drop of pH of the process liquid can be prevented. Therefore, by using the basic process liquid, the safety of the process liquid after the reaction further improves.

Here, a basic aqueous solution included in the process liquid contains at least one of an inorganic base and an organic base. As the inorganic base, for example, one or more selected from the group consisting of metal hydroxides, alkali metal salts, carbonates, hydrogencarbonates, metal oxides, and ammonium hydroxide ($NH_4OH$) are used. It is preferred that the inorganic base includes, for example, one or more selected from the group consisting of hydroxides of alkali metal element, carbonates of alkali metal element, hydrogencarbonates of alkali metal element, hydroxides of alkali earth metal element, carbonates of alkali earth metal element, and ammonium hydroxide ($NH_4OH$). In particular, it is preferred that the inorganic base is one or more selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogencarbonate and, ammonium hydroxide ($NH_4OH$). In this case, since the inorganic base having low toxicity is used, the byproduct is treated more safely. It is more preferred that the inorganic base is one or more selected from the group consisting of potassium hydroxide (KOH), sodium carbonate ($Na_2CO_3$), lithium hydroxide (LiOH), sodium hydrogencarbonate ($NaHCO_3$), and, ammonium hydroxide ($NH_4OH$). In this case, since the reaction between the process liquid and the byproduct progresses gently, the detoxification treatment of the byproduct is performed more safely.

As the organic base contained in the process liquid, for example, one or more selected from the group consisting of alkylammonium hydroxides, organic metal compounds, metal alkoxides, amines, and heterocyclic amines are used. It is preferred that the organic base is one or more selected from the group consisting of sodium phenoxide ($C_6H_5ONa$), 2-hydroxyethyltrimethylammonium hydroxide (choline hydroxide), and tetramethylammonium hydroxide (TMAH).

As the solvent of the process liquid, water is used. It is preferred that the pH of the process liquid is 8 or more and 14 or less before and after the detoxification treatment of the byproduct. The pH of the process liquid before the detoxification treatment is preferably 9 or more and 14 or less, and more preferably 10 or more and 14 or less. The process liquid may contain any ingredient such as a surfactant and a pH buffer in addition to at least one of an inorganic base and an organic base.

In one example, the controller 21 controls the operation of the flow rate regulator 47 to regulate the flow rate of the process liquid in the flow path portion 58, and thus the injection pressure of the process liquid from the supply line 35 to the emission path 11 (extension 12) is regulated to 0.1 Pa or more. By injection of the process liquid from the supply line 35 to the emission path 11 at an injection pressure of 0.1 Pa or more, the mass of the byproduct is dispersed by collision between the process liquid and the inner surface of the emission path 11 (piping that forms the emission path 11). By dispersion of the byproduct adhered to the piping or the like that forms the emission path 11, the reaction between the byproduct and the process liquid is accelerated, and detoxification of the byproduct is accelerated.

In one example, the process liquid is injected from the supply line 35 of the supplier 25 toward the pressure control valve 15 or its neighborhood in the emission path 11. As described above, in the reaction between the source gas and the substrate, a byproduct is easy to generate in the pressure control valve 15 or its neighborhood in the emission path 11 (extension 12). Therefore, by injecting the process liquid from the supply line 35 toward the pressure control valve 15 or its neighborhood, the process liquid is injected to the spot where plenty of byproduct is presumed to generate in the emission path 11. Therefore, in the spot where plenty of byproduct is presumed to generate in the emission path 11, the process liquid properly reacts with the byproduct. This accelerates the detoxification of the byproduct.

In the detoxification reaction of the byproduct by the process liquid, gas is generated. The gas generated in the reaction of detoxifying the byproduct includes hydrogen. The gas generated in the reaction of detoxifying the byproduct can contain a hydrogen halide such as hydrogen chloride. The exhauster (gas emitter) 27 exhausts the gas generated by the reaction between the byproduct and the process liquid from the emission path 11 of the emitter 10 through the exhaust line 36. As described above, in the detoxification of the byproduct, the switching valve 41 comes into the second operation state. Therefore, the emission path 11 of the emitter 10 communicates with the exhaust line 36 of the exhauster 27, and the gas is properly exhausted via the exhaust line 36.

The exhaust line 36 of the exhauster 27 is formed, for example, from the emission path 11 to the outside of the room (environment) where an operator conducts the operation. The gas generated in the reaction of detoxifying the byproduct is exhausted outside the room where the operator conducts the operation via the exhaust line 36. In one example, the gas exhausted outside the room is collected, and detoxified. In another example, the exhauster 27 includes a suction source (not shown) such as a suction pump. Then, by causing the sucking force to act on the emission path 11 and the exhaust line 36 by the suction source, the aforementioned gas is exhausted. In this case, driving of the suction source may be controlled by the controller 21.

The gas generated in the reaction of detoxifying the byproduct is mainly hydrogen. Hydrogen is lighter than air. Therefore, it is preferred that the joint portion of the exhaust line 36 to the emission path 11 is disposed in a vertically upper site in the emission path 11 (extension 12). As a result, the gas (hydrogen) generated in the reaction of detoxifying the byproduct is exhausted more properly. In one example of FIG. 1, the site on the near side (upstream side) from the reaction chamber 7 in the extension 12 (emission path 11) is situated in a vertically upper position, compared with the site on the far side (downstream side) from the reaction chamber 7 in the extension 12 (emission path 11). Then, in the site on the near side (upstream side) from the reaction chamber 7 in the extension 12 (emission path 11), the switching valve 41 is disposed, and the exhaust line 36 is connected to the emission path 11 by the switching valve 41. Therefore, the joint portion of the exhaust line 36 to the emission path 11 is disposed in a vertically upper site in the emission path 11 (extension 12).

In one example, the site on the near side (upstream side) from the reaction chamber 7 in the extension 12 (emission path 11) may be situated in a vertically lower position, compared with the site on the far side (downstream side) from the reaction chamber 7 in the extension 12 (emission path 11). Also in this case, it is preferred that the joint portion of the exhaust line 36 to the emission path 11 is disposed in a vertically upper site in the emission path 11 (extension 12). Therefore, in the present example, it is preferred that the joint portion of the exhaust line 36 to the emission path 11 is disposed, for example, in a site on the far side (downstream side) from the reaction chamber 7 in the extension 12 (emission path 11).

The process liquid reacted with the byproduct in the emission path 11 is emitted by the liquid emitter 31 from the emission path 11 via the liquid emission line 37. As described above, since the switching valve 42 is in the fourth operation state in the detoxification of the byproduct, the process liquid enters the liquid emission line 37 from the emission path 11 (extension 12). Since the switching valve 42 is in the fourth operation state, entry of the process liquid into the detoxification apparatus 3 via the relay 43 is prevented. The process liquid emitted to the liquid emission line 37 is pooled in the waste liquid tank 32. At this time, by bringing the valve 51 into the non-circulation state, the process liquid is emitted to the waste liquid tank 32 by the liquid emitter 31.

In the present embodiment, by switching each of the valves 48, 51 to the circulation state, it is possible to make the process liquid enter the flow path portion 58 of the supply line 35 from the flow path portion 61 of the liquid emission line 37 via the circulation line 52. As a result, the process liquid circulates through the flow path portion 58 of the supply line 35, the extension 12 of the emission path 11, the flow path portion 61 of the liquid emission line 37, and the circulation line 52. By circulating the process liquid as described above, it becomes possible to reduce the amount of the process liquid used for detoxification of the byproduct, and the process liquid is used effectively.

Figure 2:
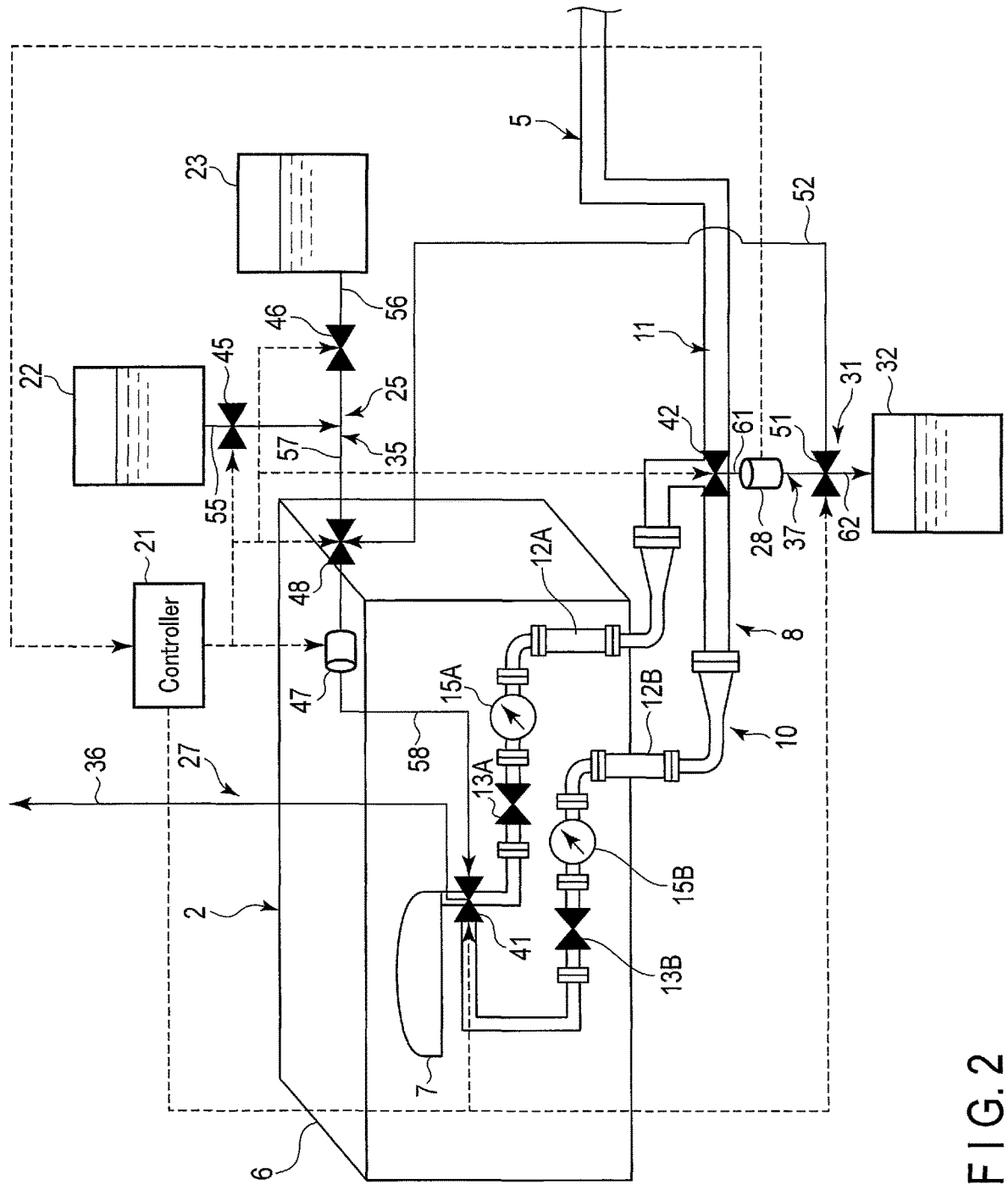
FIG. 2 is a schematic view showing an epitaxial growth apparatus according to one modification of the first embodiment.

Also in one example of FIG. 1, a site on the upstream side in the extension 12 (switching valve 41 and its neighborhood) is situated in a vertically upper position, compared with a site on the downstream side in the extension 12 (switching valve 42 and its neighborhood). The supply line 35 is situated in a vertically upper position, compared with the liquid emission line 37. Among the flow path portion 58 of the supply line 35, the extension 12 of the emission path 11, the flow path portion 61 of the liquid emission line 37, and the circulation line 52, the valve 51, which is a joint portion of the circulation line 52 to the liquid emission line 37, and its neighborhood are situated in the vertically lowest position. Therefore, when the process liquid is circulated as described above, the process liquid is drawn up from the liquid emission line 37 to the supply line 35 through the circulation line 52 by the flow rate regulator 47 such as a pump.

Here, the process liquid having reacted with the byproduct in the emission path 11, namely the process liquid emitted in the liquid emission line 37 can contain a residue that is not dissolved in the process liquid. As the residue contained in the process liquid, silicon dioxide ($SiO_2$) and the like can be recited. In one example of FIG. 1, in circulation of the process liquid, the process liquid is drawn up from the liquid emission line 37 to the supply line 35 as described above. Therefore, in the state that the process liquid is being circulated, the residue in the process liquid is easy to deposit in the joint portion of the circulation line 52 to the liquid emission line 37, namely in the valve 51 and its neighborhood. As a result, the residue in the process liquid becomes difficult to enter the supply line 35 from the liquid emission line 37, and supply of the process liquid containing plenty of residue from the supply line 35 to the emission path 11 (extension 12) is effectively prevented.

In one example of FIG. 1, the waste liquid tank 32 is situated in a vertically lower position, with respect to the valve 51, and the flow path portion 62 of the liquid emission line 37 extends vertically downwardly from the valve 51 to the waste liquid tank 32. Therefore, by switching the valve 51 from the circulation state to the non-circulation state, the residue deposited in the valve and its neighborhood in circulation of the process liquid is properly emitted to the waste liquid tank 32. In one example, a wall portion that shuts a part of the cross section of the flow path may be provided in the entry part from the liquid emission line 37 to the circulation line 52. In this case, in circulation of the process liquid, the process liquid entering the circulation line 52 from the liquid emission line 37 collides with the wall portion. By collision of the process liquid with the wall portion, the residue contained in the process liquid becomes easier to deposit in the valve 51 and its neighborhood. As a result, the residue in the process liquid becomes more difficult to enter the supply line 35 from the liquid emission line 37.

In one example, a filter may be provided in the entry part from the liquid emission line 37 to the circulation line 52. In this case, the liquid such as process liquid is able to pass through the filter, whereas the residue in the process liquid is unable to pass through the filter. By providing the filter, entry of the residue in the process liquid from the liquid emission line 37 to the supply line 35 is securely prevented. In the joint portion of the circulation line 52 to the liquid emission line 37, the residue in the process liquid securely deposits.

In the present embodiment, the sensor 28 detects a parameter relating to the state of progress of the reaction between the process liquid and the byproduct in the detoxification treatment of the byproduct. The sensor 28 conducts sensing for the process liquid emitted through the liquid emission line 37, namely, for the process liquid having reacted with the byproduct in the emission path 11. In one example of FIG. 1, the sensor 28 conducts sensing for the process liquid flowing in the flow path portion 61 of the liquid emission line 37. The sensor 28 may be integrated with the liquid emission line 37, or may be detachably attached to the liquid emission line 37. In one example, the sensor 28 is provided separately from the liquid emission line 37, and need not be mechanically connected with the liquid emission line 37. The sensor 28 can include, for example, one or more of a pH measuring instrument, a Raman spectrum analyzer, an infrared spectroscopy (IR) analyzer, and a nuclear magnetic resonance (NMR) spectrum analyzer.

The pH measuring instrument measures pH of the process liquid in the liquid emission line 37 in the detoxification treatment of the byproduct, as a parameter relating to the state of progress of the reaction between the process liquid and the byproduct. The Raman spectrum analyzer detects a Raman spectrum of the process liquid in the liquid emission line 37 in the detoxification treatment of the byproduct. In the detected Raman spectrum, the spectrum intensity in a specific wavelength region is acquired as a parameter relating to the state of progress of the reaction between the process liquid and the byproduct. The IR analyzer detects an IR spectrum of the process liquid in the liquid emission line 37 in the detoxification treatment of the byproduct. In the detected IR spectrum, the spectrum intensity in a specific wavelength region is acquired as a parameter relating to the state of progress of the reaction between the process liquid and the byproduct. The NMR spectrum analyzer detects an NMR spectrum of the process liquid in the liquid emission line 37 in the detoxification treatment of the byproduct. In the detected NMR spectrum, the spectrum intensity in a specific wavelength region is acquired as a parameter relating to the state of progress of the reaction between the process liquid and the byproduct.

In the present embodiment, the controller 21 acquires a detection result in the sensor 28. Then, the controller 21 determines the state of progress of the detoxification treatment of the byproduct based on the detection result in the sensor 28, and determines whether or not the byproduct has been detoxified properly. In one example, a notifying apparatus (not shown) that notifies that the byproduct has been properly detoxified may be provided. In this case, when the controller 21 determines that the byproduct has been properly detoxified, the notifying apparatus is operated to notify that the byproduct has been properly detoxified. The notification is performed by any one of emitting a sound, lighting, displaying on the screen and the like. In one example, whether or not the byproduct has been properly detoxified may be determined by an operator instead of the controller 21. In this case, the operator acquires a detection result in the sensor 28, and determines whether or not the byproduct has been properly detoxified based on the acquired detection result.

As described above, by the reaction between the byproduct and the process liquid, a hydrogen halide is generated. An aqueous solution of a hydrogen halide is acidic. Therefore, as the detoxification treatment of the byproduct progresses, the pH of the process liquid decreases. Therefore, it becomes possible to appropriately determine the state of progress of the reaction between the process liquid and the byproduct based on the pH of the process liquid flowing in the liquid emission line 37, and it becomes possible to appropriately determine the state of progress of the detoxification treatment.

By the reaction between the byproduct and the process liquid, the bonding state between atoms, the molecular structure and the like change in components contained in the byproduct. For example, as described above, by the reaction between the byproduct and the process liquid, a Si-α bond (α represents one or more halogen elements selected from the group consisting of Cl, Br, F, and I) and a Si—Si bond are broken in a halosilanes. By the reaction between the byproduct and the process liquid, a siloxane bond and a Si—Si bond are broken in the aforementioned hydrolysate. Therefore, as the detoxification treatment of the byproduct progresses, the bonding state between atoms, the molecular structure and the like change in the mixture with the process liquid flowing in the liquid emission line 37. Since the bonding state between atoms, the molecular structure and the like change in the mixture with the process liquid, the Raman spectrum, the IR spectrum, and the NMR spectrum also change with the detoxification treatment of the byproduct. Therefore, it becomes possible to appropriately determine the state of progress of the reaction between the process liquid and the byproduct based on the spectrum intensity of any one of the Raman spectrum, the IR spectrum, and the NMR spectrum, and it becomes possible to appropriately determine the state of progress of the detoxification treatment.

In one example, the controller 21 may control operation of each of the switching valves 41, 42, the valves 45, 46, 48, 51, and the flow rate regulator 47 based on the detection result in the sensor 28. For example, when it is determined that the byproduct has been properly detoxified based on the detection result in the sensor 28, the controller 21 brings the valve 46 into the closed state, and brings each of the valve 48 and the valve 51 into the non-circulation state. As a result, supply of the process liquid to the emission path 11 is stopped.

In one example, when it is determined that the progress speed of detoxification of the byproduct is slow based on the detection result in the sensor 28, the controller 21 controls the flow rate regulator 47 to increase the flow rate of the process liquid in the flow path portion 58 of the supply line 35. As a result, the injection pressure of the process liquid from the supply line 35 to the emission path 11 increases, and the reaction between the process liquid and the byproduct is accelerated in the emission path 11. Accordingly, detoxification of the byproduct is accelerated. In another example, when it is determined that the progress speed of detoxification of the byproduct is slow based on the detection result in the sensor 28, for example, the controller 21 extends the time of the treatment with the process liquid. In this case, the controller 21 may notify that the concentration of the process liquid is increased in the next and later treatments.

In one example, when it is determined that the progress speed of detoxification of the byproduct is slow based on the detection result in the sensor 28 in the state that the process liquid is circulated through the circulation line 52 as described above, the controller 21 brings each of the valves 48, 51 into the non-circulation state, and brings the valve 46 into the open state. As a result, the circulating process liquid is emitted to the waste liquid tank 32, and new process liquid is supplied from the process liquid tank 23 to the emission path 11. By supply of new process liquid to the emission path 11, the reaction between the process liquid and the byproduct is accelerated in the emission path 11, and detoxification of the byproduct is accelerated.

As the detoxification treatment of the byproduct with the process liquid described above ends, and supply of the process liquid to the emission path 11 is stopped, the valve 45 is brought into the open state. As a result, wash water is supplied from the wash water tank 22 to the emission path 11, and the emission path 11 (extension 12) is washed with the wash water. Also in the washing with the wash water, each of the valves 48, 51 can be switched to the circulation state as is the case with the detoxification of the byproduct with the process liquid. As each of the valves 48, 51 comes into the circulation state, the wash water circulates through the flow path portion 58 of the supply line 35, the extension 12 of the emission path 11, the flow path portion 61 of the liquid emission line 37, and the circulation line 52.

As the washing of the emission path 11 with the wash water ends, the valve 45 is brought into the closed state and each of the valve 48 and the valve 51 is brought into the non-circulation state. As a result, supply of the wash water to the emission path 11 is stopped. When a silicon-containing film is formed on the substrate after washing of the emission path 11, the switching valve 41 is switched to the first operation state, and the switching valve 42 is switched to the third operation state. As a result, the reaction chamber 7 communicates with the detoxification apparatus 3 via the emission path 11. The pressure control valve 15 reduces the pressure of the reaction chamber 7. In the reaction chamber under reduced pressure, the source gas and the substrate are reacted as described above to form a silicon-containing film on the substrate.

In the epitaxial growth apparatus 1 which is the silicon-containing product forming apparatus of the present embodiment as described above, the byproduct generated by the reaction between the gas containing silicon and a halogen element and the substrate is safely detoxified in the emission path 11. In the epitaxial growth apparatus 1, since the byproduct is detoxified without detachment of the piping that forms the emission path 11, the detoxification treatment of the byproduct is performed more safely. In the epitaxial growth apparatus 1, the gas (hydrogen) generated by the reaction between the process liquid and the byproduct is properly exhausted by the exhauster 27. Since a parameter relating to the state of progress of the reaction between the process liquid and the byproduct in the emission path 11 is detected by the sensor 28, it becomes possible to appropriately determine the state of progress of the detoxification of the byproduct based on the detection result in the sensor 28.

Modifications

The epitaxial growth apparatus 1 is not necessarily provided with the aforementioned sensor 28. The epitaxial growth apparatus 1 need not be provided with the circulation line 52. In this case, it is no longer necessary to provide the valves 48, 51.

In one modification, a plurality of extensions extending in parallel with each other may be provided in the emission path 11 of the emitter 10. For example, in the modification shown in FIG. 2, the emission path 11 is provided with two extensions 12A, 12B extending in parallel with each other. Also in the present modification, the epitaxial growth apparatus 1 includes the reaction chamber 7, the emitter 10, the controller 21, the wash water tank 22, the process liquid tank 23, the supplier 25, the exhauster 27, the sensor 28, the liquid emitter 31, the waste liquid tank 32, the switching valves (flow path switcher) 41, 42, and the circulation line 52 as is the case with the first embodiment. In FIG. 2, the solid arrow indicates the flow of fluids such as liquid and gas, and the dotted arrow indicates electric signals such as input signals to the controller 21 and output signals from the controller 21.

In the present modification, the extensions 12A, 12B extend in parallel with each other between the switching valves 41, 42 of the emission path 11. Therefore, the extensions 12A, 12B branch at the switching valve 41 and meet at the switching valve 42. The extensions 12A, 12B can communicate with the reaction chamber 7 that is identical for each extension. Each of the extensions 12A, 12B is formed in the same manner as the extension 12 of the first embodiment. Therefore, in the extension 12A, a chamber isolation valve 13A that is the same as the chamber isolation valve 13, and a pressure control valve 15A that is the same as the pressure control valve 15 are disposed. In the extension 12B, a chamber isolation valve 13B that is the same as the chamber isolation valve 13, and a pressure control valve 15B that is the same as the pressure control valve 15 are disposed.

In the present modification, the switching valve 41 is switchable between a first operation state and a second operation state. In the first operation state of the switching valve 41, the extension (first extension) 12A of the emission path 11 communicates with the reaction chamber 7. In the first operation state of the switching valve 41, however, communication of the extension 12A of the emission path 11 with each of the supply line 35 of the supplier 25, and the exhaust line 36 of the exhauster 27 is blocked. In the first operation state of the switching valve 41, the extension (second extension) 12B of the emission path 11 communicates with each of the supply line 35 of the supplier 25 and the exhaust line 36 of the exhauster 27. In the first operation state of the switching valve 41, however, communication of the extension 12B of the emission path 11 with the reaction chamber 7 is blocked.

In the second operation state of the switching valve 41, the extension (first extension) 12A of the emission path 11 communicates with each of the supply line 35 of the supplier 25 and the exhaust line 36 of the exhauster 27. In the second operation state of the switching valve 41, however, communication of the extension 12A of the emission path 11 with the reaction chamber 7 is blocked. In the second operation state of the switching valve 41, the extension (second extension) 12B of the emission path 11 communicates with the reaction chamber 7. In the second operation state of the switching valve 41, however, communication of the extension 12B of the emission path 11 with each of the supply line 35 of the supplier 25, and the exhaust line 36 of the exhauster 27 is blocked. Therefore, switching of the operation state of the switching valve (flow path switcher) 41 results in switching of the communication state of each of the extensions 12A, 12B of the emission path 11 with each of the reaction chamber 7, the supply line 35 of the supplier 25, and the exhaust line 36 of the exhauster 27.

In the present modification, the switching valve 42 is switchable between a third operation state and a fourth operation state. In the third operation state of the switching valve 42, the extension (first extension) 12A of the emission path 11 communicates with the detoxification apparatus 3 via the relay 43. In the third operation state of the switching valve 42, however, communication of the extension 12A of the emission path 11 with the liquid emission line 37 of the liquid emitter 31 is blocked. In the third operation state of the switching valve 42, the extension (second extension) 12B of the emission path 11 communicates with the liquid emission line 37. In the third operation state of the switching valve 42, however, communication of the extension 12B of the emission path 11 with the detoxification apparatus 3 (relay 43) is blocked.

In the fourth operation state of the switching valve 42, the extension (first extension) 12A of the emission path 11 communicates with the liquid emission line 37. In the fourth operation state of the switching valve 42, however, communication of the extension 12A of the emission path 11 with the detoxification apparatus 3 (relay 43) is blocked. In the fourth operation state of the switching valve 42, the extension (second extension) 12B of the emission path 11 communicates with the detoxification apparatus 3 via the relay 43. In the fourth operation state of the switching valve 42, however, communication of the extension 12B of the emission path 11 with the liquid emission line 37 is blocked. Therefore, switching of the operation state of the switching valve (flow path switcher) 42 results in switching of the communication state of each of the extensions 12A, 12B of the emission path 11 with each of the liquid emission line 37 of the liquid emitter 31, and the detoxification apparatus 3.

In the epitaxial growth apparatus 1 of the present modification, it becomes possible to emit the source gas having reacted with the substrate from the reaction chamber 7 through one of the extensions 12A, 12B as an emission gas, while detoxifying the byproduct with a process liquid in the other one of the extensions 12A, 12B. For example, as the switching valve 41 comes into the first operation state, and the switching valve 42 comes into the third operation state, the reaction chamber 7 communicates with the detoxification apparatus 3 through the extension 12A and the relay 43. Therefore, even when the source gas is reacted with the substrate in the reaction chamber 7, the emission gas by the reaction between the source gas and the substrate is emitted through the extension 12A. As the switching valve 41 comes into the first operation state, it becomes possible to supply the extension 12B with the process liquid through the supply line 35. By the supplied process liquid, the byproduct is detoxified in the extension 12B. As the switching valve 42 comes into the third operation state, it becomes possible to emit the process liquid having reacted with the byproduct in the extension 12B, from the extension 12B through the liquid emission line 37.

On the other hand, as the switching valve 41 comes into the second operation state, and the switching valve 42 comes into the fourth operation state, the reaction chamber 7 communicates with the detoxification apparatus 3 through the extension 12B and the relay 43. Therefore, even when the source gas is reacted with the substrate in the reaction chamber 7, the emission gas by the reaction between the source gas and the substrate is emitted through the extension 12B. As the switching valve 41 comes into the second operation state, it becomes possible to supply the extension 12A with the process liquid through the supply line 35. By the supplied process liquid, the byproduct is detoxified in the extension 12A. As the switching valve 42 comes into the fourth operation state, it becomes possible to emit the process liquid having reacted with the byproduct in the extension 12A, from the extension 12A through the liquid emission line 37.

In the aforementioned embodiments and the like, part of the supply line 35 of the supplier 25 is commonly used for supply of wash water and for supply of process liquid, however, it is not limited to this. In one modification, the entire supply line of process liquid from the process liquid tank 23 to the emission path 11 may be formed independently of the supply line of wash water from the wash water tank 22 to the emission path 11.

The apparatus in which the byproduct containing halosilanes and the like is generated in the emission path (for example, 11) as described above is not limited to the aforementioned epitaxial growth apparatus. In a silicon-containing product forming apparatus of one example, the reaction chamber (for example, 7) is supplied with a raw material containing silicon and a raw material containing a halogen element in separate routes. The raw material including silicon can contain powdery (solid) silicon. The raw material including a halogen element can be a source gas that contains a hydrogen halide such as hydrogen chloride.

In the silicon-containing product forming apparatus of the present example, the reaction chamber (for example, 7) is not provided with a substrate such as a silicon substrate. In the reaction chamber, the raw material containing silicon and the raw material containing a halogen element that are introduced in the separate routes react. By the reaction between the raw material containing silicon and the raw material containing a halogen element, halosilanes and hydrogen are generated. By the reaction between halosilanes and hydrogen, a silicon-containing product is obtained. Halosilanes generated by the reaction between the raw material containing silicon and the raw material containing a halogen element can include chlorosilanes such as trichlorosilane ($SiHCl_3$). In the reaction in the reaction chamber, a hydrogen halide, a silicon tetrahalide and the like can be generated.

Also in the silicon-containing product forming apparatus of the present example, the emission gas (emission material) emitted from the reaction chamber contain halosilanes, and the halosilanes contained in the emission gas can include the aforementioned chlorosilanes such as trichlorosilane. The emission gas from the reaction chamber can contain hydrogen, and can contain a hydrogen halide, a silicon tetrahalide and the like generated by the reaction in the reaction chamber. The hydrogen halide generated by the reaction in the reaction chamber can include hydrogen chloride (HCl). The silicon tetrahalide generated by the reaction in the reaction chamber can include silicon tetrachloride ($SiCl_4$).

In the silicon-containing product forming apparatus of the present example, the emission path (emission tube 8) of the emission gas (emission material) from the reaction chamber is provided with a cooler configured to cool the emission gas. The emission gas liquefies by being cooled by a cooler. Then, the liquid substance (emission material) generated by liquefaction of the emission gas is collected.

Also in the silicon-containing product forming apparatus of the present example, a byproduct can precipitate in the emission path (for example, 11) by liquefaction of the emission gas by the cooler. The byproduct can contain part that is not collected in the liquid substance of the emission gas, and remains in the emission path (for example, 11). The byproduct contains halosilanes contained in the emission gas, and can contain a hydrolysate of halosilanes. The hydrolysate of halosilanes can be a solid substance. The byproduct can contain a silicon tetrahalide or the like contained in the emission gas. In the emission path (for example, 11), a byproduct is easy to precipitate particularly in the cooler and its neighborhood.

As described above, also in the silicon-containing product forming apparatus of the present example, a byproduct containing halosilanes and like can precipitate in the emission path (for example, 11). The byproduct generated in the silicon-containing product forming apparatus of the present example can also degenerate into a substance having explosiveness. Therefore, also in the silicon-containing product forming apparatus of the present example, the byproduct is detoxified with the process liquid in the emission path (for example, 11) in the same manner as in any one of the aforementioned embodiment and the like.

According to the silicon-containing product forming apparatus of at least one embodiment or example, the supplier supplies the emission path of the emitter with process liquid from the process liquid tank through the supply line, and the byproduct generated by the reaction is treated in the emission path with the supplied process liquid. The flow path switcher switches the communication state of the emission path of the emitter with each of the reaction chamber and the supply line of the supplier. As a result, it is possible to provide a silicon-containing product forming apparatus with which a byproduct generated in reaction of a raw material containing silicon and a halogen element, or in reaction between a raw material containing silicon and a raw material containing a halogen element is treated without detachment of piping that forms the emission path.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A silicon-containing product forming apparatus, comprising:
    a reaction chamber in which a raw material including silicon and a halogen element is reacted, or a raw material including silicon and a raw material including a halogen element are reacted;
    an emission path configured to emit an emission material from the reaction chamber, the emission path being incorporated in an emitter, the emission path including a first extension, and the emission material from the reaction chamber being emitted toward a downstream side in the first extension;
    a process liquid tank storing a process liquid including a basic aqueous solution;
    a supplier including a supply line configured to supply the emission path with the process liquid from the process liquid tank, the supplier being configured to treat a byproduct generated by reaction, with the supplied process liquid in the emission path;
    an exhauster including an exhaust line configured to exhaust a gas generated by reaction between the process liquid and the byproduct from the first extension of the emission path; and
    a first flow path switcher which is disposed between the first extension and the reaction chamber in the emission path, and to which the supply line of the supplier and the exhaust line of the exhauster are connected, the first flow path switcher being switchable between a first operation state and a second operation state, the first extension of the emission path communicating with the reaction chamber and communication of the first extension with the supply line and the exhaust line being blocked in the first operation state of the first flow path switcher, and the first extension communicating with the supply line and the exhaust line and communication of the first extension with the reaction chamber being blocked in the second operation state of the first flow path switcher.

2. The silicon-containing product forming apparatus according to claim 1, wherein a joint portion of the exhaust line of the exhauster to the first extension of the emission path is situated in a vertically upper site in the first extension of the emission path.

3. The silicon-containing product forming apparatus according to claim 1, further comprising:
    a liquid emitter including a liquid emission line configured to emit the process liquid having reacted with the byproduct in the first extension of the emission path from the first extension of the emission path; and
    a second flow path switcher which switches a communication state of the first extension of the emission path with the liquid emission line of the liquid emitter.

4. The silicon-containing product forming apparatus according to claim 1, further comprising a pressure control valve disposed in the first extension of the emission path, wherein
    the pressure control valve is configured to increase a pressure of the first extension of the emission path in a region on a side opposite to the reaction chamber with respect to the pressure control valve, compared with a region on the reaction chamber side with respect to the pressure control valve in a state that reaction using the raw material is conducted in the reaction chamber, and
    the process liquid supplied to the first extension of the emission path is injected from the supply line of the supplier toward the pressure control valve or a neighborhood of the pressure control valve in the first extension.

5. The silicon-containing product forming apparatus according to claim 1, wherein the process liquid supplied to the first extension of the emission path is injected from the supply line of the supplier to the first extension at an injection pressure of 0.1 Pa or more.

6. The silicon-containing product forming apparatus according to claim 1, wherein
the emission path includes a second extension which extends in parallel with the first extension, and which is capable of communicating with the reaction chamber that is identical for the first extension, and
the first flow path switcher switches a communication state of the second extension with each of the reaction chamber, the supply line of the supplier, and the exhaust line of the exhauster.

7. The silicon-containing product forming apparatus according to claim 6, wherein
in the first operation state of the first flow path switcher, the second extension communicates with the supply line of the supplier and the exhaust line of the exhauster and communication of the second extension with the reaction chamber is blocked, and
in the second operation state of the first flow path switcher, the second extension communicates with the reaction chamber and communication of the second extension with the supply line and the exhaust line is blocked.

8. The silicon-containing product forming apparatus according to claim 1, further comprising a sensor configured to detect a parameter relating to a state of progress of reaction between the process liquid and the byproduct in the first extension of the emission path.

* * * * *